(12) United States Patent
Werschnik et al.

(10) Patent No.: US 9,971,149 B2
(45) Date of Patent: May 15, 2018

(54) METHOD FOR PRODUCING A WAVEFRONT-CORRECTED OPTICAL ARRANGEMENT COMPRISING AT LEAST TWO OPTICAL ELEMENTS

(71) Applicant: JENOPTIK Optical Systems GmbH, Jena (DE)

(72) Inventors: Jan Werschnik, Jena (DE); Markus Augustin, Jena (DE)

(73) Assignee: Jenoptik Optical Systems GmbH, Jena (DE)

( * ) Notice: Subject to any disclaimer, the term of this patent is extended or adjusted under 35 U.S.C. 154(b) by 388 days.

(21) Appl. No.: 14/654,076

(22) PCT Filed: Dec. 13, 2013

(86) PCT No.: PCT/EP2013/003773
§ 371 (c)(1),
(2) Date: Jun. 19, 2015

(87) PCT Pub. No.: WO2014/095013
PCT Pub. Date: Jun. 26, 2014

(65) Prior Publication Data
US 2015/0346488 A1 Dec. 3, 2015

(30) Foreign Application Priority Data

Dec. 20, 2012 (DE) .................. 10 2012 112 773

(51) Int. Cl.
*G06G 7/48* (2006.01)
*G02B 27/00* (2006.01)
(Continued)

(52) U.S. Cl.
CPC ..... *G02B 27/0012* (2013.01); *G02B 27/0025* (2013.01); *G06F 17/10* (2013.01); *G06F 17/50* (2013.01)

(58) Field of Classification Search
CPC ........ A61F 9/00804; A61F 9/008; G01J 9/00; G01J 9/0215; G02B 17/0832; G02B 23/00
See application file for complete search history.

(56) References Cited

U.S. PATENT DOCUMENTS 5,265,034 A * 11/1993 Breckenridge ........ G02B 23/00
250/201.1
5,350,911 A * 9/1994 Rafanelli .................. G01J 9/00
250/201.9
(Continued)

FOREIGN PATENT DOCUMENTS

CN 101968567 A 2/2011
DE 102 58 715 A1 8/2004
(Continued)

*Primary Examiner* — Kandasamy Thangavelu
(74) *Attorney, Agent, or Firm* — Muncy, Geissler, Olds & Lowe, P.C.

(57) ABSTRACT

The invention relates to a method for producing a wavefront-corrected optical arrangement comprising at least two optical elements. Using the method, a total wavefront error in the optical arrangement is determined and compared to a permissible tolerance range for the total wavefront error. To perform the method, the optical elements are individualized by assigning an individual identifier to each of them, such that individualized optical elements are obtained, individual surface defects are measured with correct coordinates on all the individualized optical elements and the measured individual surface defects are stored with correct coordinates assigned to the appropriate individualized optical element. The optical arrangement comprising the individualized optical elements is produced virtually as a virtual optical arrangement and a total wavefront error is calculated for the virtual optical arrangement.

15 Claims, 4 Drawing Sheets

(51) Int. Cl.
*G06F 17/50* (2006.01)
*G06F 17/10* (2006.01)

(56) References Cited

U.S. PATENT DOCUMENTS

| | | | | |
|---|---|---|---|---|
| 5,457,533 A * | 10/1995 | Wilcken | ............... | G01J 9/0215 356/491 |
| 5,966,243 A | 10/1999 | Braunecker et al. | | |
| 7,283,204 B2 | 10/2007 | Wegmann | | |
| 2005/0096640 A1* | 5/2005 | Dai | ..................... | A61F 9/008 606/10 |
| 2006/0109559 A1* | 5/2006 | Hudyma | ............ | G02B 17/0832 359/649 |
| 2013/0190736 A1* | 7/2013 | Fabrikant | ............ | A61F 9/00804 606/5 |

FOREIGN PATENT DOCUMENTS

| | | |
|---|---|---|
| DE | 10 2005 022 459 A1 | 11/2006 |
| EP | 0 823 976 B1 | 3/2002 |
| WO | WO 2005/121899 A1 | 12/2005 |

* cited by examiner

METHOD FOR PRODUCING A WAVEFRONT-CORRECTED OPTICAL ARRANGEMENT COMPRISING AT LEAST TWO OPTICAL ELEMENTS

This nonprovisional application is a national stage of International Application No. PCT/EP2013/003773, which was filed on Dec. 13, 2013, and which claims priority to German Patent Application No. 10 2012 112 773.5, which was filed in Germany on Dec. 20, 2012, and which are both herein incorporated by reference.

BACKGROUND OF THE INVENTION

Field of the Invention

When producing optical arrangements, in particular optical high performance systems, very strict requirements are imposed on the tolerances of the entire optical arrangement and the resulting permissible tolerances of the individual components.

Deviations of individual components from a theoretically ideal shape and an ideal optical behavior usually manifest in the form of a wavefront error of the beams that pass through the optical arrangement. Wavefront errors are two-dimensional or three-dimensional deviations of the wave fronts (loci of identical phase) from an ideal wavefront, such as for example an ideal plane wavefront (plane wave) or an ideal spherical wavefront (spherical wave).

Description of the Background Art

The manufacture and the use of individual components with narrow tolerance limits are complex in terms of production, result in many waste parts, require a high level of outlay in terms of measurement and are therefore expensive, and it is difficult to produce them in relatively large numbers.

One possibility for minimizing the production complexity of the individual components is the introduction of at least two prefabricated optical compensation elements into the beam path of an optical arrangement in order to compensate a wavefront deformation (=wavefront error), as is known for example from EP 0 823 976 B1. To this end, the wavefront error at the optical arrangement is measured using a wavefront measuring instrument. The optical compensation elements are chosen in correspondence with the measurement result. The disadvantage of this solution is the necessary provision of a number of optical compensation elements, the necessity for further elements in the optical arrangement, and the high assembling complexity and space requirement for the optical compensation elements.

Another approach is known from DE 102 58 715 B4. In the method for producing an optical arrangement in the form of an optical imaging system having a multiplicity of optical elements, which is disclosed therein, first the optical arrangement is assembled. In this case, the optical elements are arranged in their correct positions. Subsequently, the assembled optical arrangement is measured, and a wavefront error in the exit pupil or in a face of the optical arrangement that is conjugate therewith is ascertained in a spatially resolved manner. In a next step, at least one correction area that is provided as a correction asphere at least one of the optical elements is selected, and a topography and/or a refractive index distribution of the correction area is calculated, with which correction of the ascertained wavefront error for the optical arrangement can be effected. In order to be able to bring about the necessary changes in correspondence with the calculated topography and/or the refractive index distribution of the correction area, the at least one correction asphere is removed from the optical arrangement and processed in a spatially resolved manner. It is important here to return the correction asphere after complete processing to the correct coordinates, i.e. with the alignment and rotary position that were used in the calculation of the correction values (topography and/or refractive index distribution) so as to achieve the desired effect of the correction of the wavefront error. The compensating element corrects the sum of the errors of the individual optical elements.

One disadvantage of this procedure is that the optical arrangement first has to be in fact assembled, then partially disassembled and finally re-assembled, and if necessary calibrated again. As a result, additional work steps are necessary to produce the optical arrangement.

From a solution according to DE 10 2005 022 459 A1, a method for optimizing the quality of an optical system is known, which comprises at least two elements with optically effective surfaces (optical elements). A resulting specific wavefront error is ascertained from the individual optical elements or from groups of optical elements by determining deviations of an actual form of the surface shapes from a predetermined form, and subsequently the relevant specific wavefront error is calculated by way of computer. The only disclosed calculation rule is, however, here not suitable for field-dependent simulation of the specific wavefront errors. The expected total wavefront error of the optical system is predetermined by way of computer on the basis of the calculation results, and it is ascertained by way of which surface shapes the total wavefront error can be corrected, wherein the ascertained specific wavefront errors are taken as the basis. These ascertained surface shapes are formed on at least one surface, and only then is the optical system actually assembled. According to the procedure of DE 10 2005 022 459 A1, the wavefront errors are corrected in a field-independent manner. This approach is not expedient in field-dependent optical systems (for example projection lenses), since the wavefront error of a field point requires individual (=field-point-dependent) correction. According to DE 10 2005 022 459 A1, each wavefront error is corrected at the same wavefront (phase function), as a result of which the correction potential is not fully exploited.

SUMMARY OF THE INVENTION

The invention is based on the object of proposing a method with which efficient production of a wavefront-corrected optical arrangement is possible.

The object is achieved with a method for producing a wavefront-corrected optical arrangement comprising at least two optical elements, in which in a step a) a total wavefront error for the optical arrangement is ascertained; in a step b) the total wavefront error is compared to a permissible tolerance range for the total wavefront error; in a step c) at least one of the optical elements is selected if the permissible tolerance range is exceeded, and in a step d) the optical properties of the at least one selected optical element are changed such that the ascertained total wavefront error for the optical arrangement will be within the permissible tolerance range. The method according to the invention is characterized in that in a step a-2), which is to be carried out before step a), the optical elements are individualized by assigning them in each case an individual identifier. The individual identifier can be, for example, an identifying number, a combination of letters, numbers and characters, or a barcode on a mount of the optical element. The identifier can also be present on a face, for example a circumferential face of the optical element. A biunique storage position of the respective optical element, for example in a warehouse, can also be used as an individual identifier, without the optical element physically containing an identifier. Individual surface errors are measured with the correct coordinates for all individualized optical elements, and the measured individual surface errors are stored with the correct coordinates in a manner in which they are assigned to the respective individualized optical element. What is useful here is for each optical element to receive a mark, from which a specific rotary position of the optical element can be derived. In further embodiments of the invention, the identifier can be used as the mark, the mark can be part of the identifier, or the mark can be integrated in the identifier. In a step a-1), which is likewise to be carried out before step a), the optical arrangement with the individualized optical elements is produced virtually such that a virtual optical arrangement is produced. In step a) the total wavefront error of the virtual optical arrangement is ascertained, by way of calculation, from the individual surface errors and over all field points. The result is a calculated total wavefront error, wherein the total wavefront error is the totality of wavefront errors over all field points, such that correction of the total wavefront error is made possible for all field points simultaneously.

In step b) the calculated total wavefront error is compared to the permissible tolerance range for the total wavefront error. The optical properties of the at least one selected individualized optical element are changed virtually in step d) such that the calculated total wavefront error for the optical arrangement will be within the permissible tolerance range. The virtually effected changes to the optical properties of the at least one selected individualized optical element are stored as processing data in a step e) and made available such that they can be retrieved repeatedly. Finally, in a step f), the at least one selected individualized optical element is processed according to the processing data, and the optical arrangement is produced with the individualized optical elements. After step f), the optical arrangement has been produced and actually physically exists.

Wavefront errors are deviations of an actual wavefront from an ideal wavefront (for example sphere or plane wave). The wavefront errors result for example in Seidel aberrations, image field curvatures, point images and distortions. The latter can be described as a tilting of the wavefront.

A total wavefront error is understood to mean the totality of wavefront errors over all field points. The advantage of the method according to the invention is that a field-dependent simulation is made possible and the total wavefront error can be optimized simultaneously for all field points. Field points within the meaning of the description can also be object points. Here, the total wavefront error is optimized such that it is within the permissible tolerance range.

A field (short for field of view) is here understood to mean the totality of all field points.

A field point is the starting point or the starting angle of a beam. Field points are positions in the field which can be indicated by way of coordinates. A total beam is here the combination of all beams.

The term field-dependent simulation means that the wavefront error contributions of any one surface are calculated (simulated) in dependence on the field point. Typically, an optical system has lenses, in which the beams of different field points pass through very different volumes (in particular parts of the surface) (what are known as field-side lenses). In other lenses, referred to as pupil-side, or optically effective faces, beams from different field points pass through nearly identical volumes. The volumes through which beams pass differently must be taken into account in the simulation. Field-side lenses are therefore particularly suitable for correcting field-dependent wavefront errors.

The term correction in this description with respect to the method according to the invention is understood to mean that the total wavefront error is optimized with regard to a target value (permissible tolerance range). If the total wavefront error is greater or smaller than the target value, adequate correction is necessary so that the total wavefront error once again matches the target value. With careful execution of the correction, the total wavefront error is optimized.

Optical elements are not ideal across their extent, but have small deviations caused by the material and production methods (surface errors, irregularities). Here, for example, individual regions of the surface of the optical element in each case contribute individually to a wavefront error caused by the optical element. Said individual surface errors can be measured for example by tactile means, by interferometer or by strip projection.

What is essential for the invention is the knowledge that the total wavefront error is caused only to a minor extent by the mounts, the material homogeneity and the coatings of the individual individualized optical elements. The most significant contribution to the total wavefront error for the optical arrangement stems from irregularities on the surface. It is therefore possible to calculate a total wavefront error for an optical arrangement merely on the basis of coordinate-correct measurement data of the individualized optical elements. Coordinate-correct means that the contributions to the individual wavefront errors are assigned to the respective regions of the considered optical element and, with knowledge of the respective rotary position of the optical element, the spatial arrangement of the regions and the wavefront errors caused thereby are known. A rotary position can be defined for example with respect to a fixed reference point and/or a reference plane (for example a fixed coordinate system in a laboratory or a production facility).

In a first embodiment of the method according to the invention, only those individualized optical elements are taken into account with which the permissible tolerance limits for the individual wavefront errors are observed. In a further embodiment of the method according to the invention, individualized optical elements with which the permissible tolerance limits are not observed are also used. The use of individualized optical elements which would otherwise need to be rejected or re-processed is made possible in an advantageous manner with the method according to the invention since the total wavefront error is optimized.

The term total wavefront error refers to a target value that is to be measured during the execution of the method according to the invention. This can also be obtained, for example after the total wavefront error is decomposed into Zernike coefficients, by individual Zernike coefficients. The target value can be changed so that the total wavefront error can be influenced in a targeted manner.

A very expedient embodiment of the method according to the invention is achieved if in step a) a number of virtual beams (=partial beams of a total beam) are produced and the behavior thereof when passing through the virtual optical arrangement is calculated. The starting point of the virtual beams is the object plane. In step a), any desired number of field points are considered, and a virtual beam is produced for each field point. The projection of each virtual beam onto each surface of each individualized optical element (subaperture) while it passes through the virtual optical arrangement is calculated.

With a projection of a virtual beam starting from a field point on each surface of each individualized optical element, an area is covered which, depending on the position of the individualized optical element in the beam path of the optical arrangement and the associated divergence, convergence or parallelism of the rays of the respective virtual beam at this position, has a specific size, shape and position relative to the optical arrangement. For each field point, this specific size, shape and position relative to the optical arrangement is ascertained and stored in each case as what is known as a subaperture. That is to say, each field point leaves, by way of the virtual beam, an individual "footprint" (region) on the surface of the individualized optical element. Irregularities on the surface of the individualized optical elements within such a region (=subaperture) can be converted for example via the refractive index of the individualized optical element into an individual wavefront error and stored. Each individual wavefront error contributes to the calculated total wavefront error.

Any surface and any subaperture can be described in various ways that are known to a person skilled in the art by using a reference system. For example, a reference system, for example a reference plane or a suitable coordinate system, can be defined, with respect to which the surface or the subaperture can be described uniquely. Coordinate systems can be, for example, two-dimensional or three-dimensional Cartesian coordinate systems or polar coordinate systems. The surface and/or the subaperture can also be described by function systems. For example, an irregularity or an individual wavefront error can be described by a Zernike representation using the Zernike polynomials. At the same time, the coefficients have an application-oriented relevance. They enable better assessment of the effect of the individual surfaces or of the subapertures on the entire optical arrangement. A reference system can be selected in dependence on the configuration of a respective (individualized) optical element. A description of the surface is given in a coordinate-correct and position-correct fashion.

A contribution to the calculated total wavefront error can be derived from each subaperture. The calculated total wavefront error is therefore understood to mean, and can be illustrated as, a resulting error from the number of contributions of the subapertures. The calculated total wavefront error can therefore be ascertained by adding up the derived contributions with the correct sign and correct orientation. In a further embodiment of the method according to the invention, the derived contributions to the calculated total wavefront error are decomposed into coefficients, and subsequently the coefficients are added up with the correct sign and correct orientation.

The virtual beams can be arranged in any desired grid with preferably known grid spacings with respect to one another. While the grid spacings here are preferably known, they do not have to be identical. The grid can therefore be regular, irregular, or a combination of regular and irregular grid spacings. The grid can be in the form of a matrix of field points. It may be useful for example to select the grid spacings that are situated far away from the optical axis to be smaller than those that are situated near the optical axis. As a result, sufficient coverage of the edge regions of the individualized optical elements by the virtual beams is therefore advantageously achieved.

Of particular importance here is that the grid spacings are selected such that the subapertures at least partially overlap on a surface of the selected individualized optical element. The degree of overlap can be given in percent for example as a ratio of the cross-sectional areas of the virtual beams at the position of the surface of the individualized optical element to the area on which the virtual rays of at least two virtual beams impinge. Complete overlap has the advantage that the correction area to be calculated of the selected individualized optical element does not need to be interpolated at any point and thus calculation artefacts are avoided that could possibly result in a falsification of the total wavefront error between the grid points.

It is furthermore possible to take into account sag and other deformations of the individualized optical elements, as can occur for example when mounting the individualized optical elements. If these are taken into account, the calculation using the method according to the invention will better match an actual total wavefront error.

In a development of the method according to the invention, it is furthermore possible to select from a number of individualized optical elements and to combine such individualized optical elements in a respective optical arrangement, with the use and combination of which necessary changes can be carried out efficiently in terms of process and manufacturing. On the basis of the measurement data, combinations of the individualized optical elements can be selected from a number of individualized optical elements. The selection of the combinations is effected such that the processing data calculated for a combination is optimized in terms of production. For example, it is possible in this way to produce, measure and individualize larger batches of the optical elements. From said batches, optimized selection of the individualized optical elements is possible, with which a maximum number of optical arrangements for changing the individualized optical elements can be produced with minimum effort.

In a developing embodiment of the method according to the invention, a virtual change in the rotary position ("clocking") of at least one individualized optical element is carried out. Necessary changes can thereby thus be reduced or be avoided entirely if advantageously compensatory effects can be used due to a change in the rotary position. This procedure can be combined with the above-described selection of individualized optical elements.

It is additionally possible with the method according to the invention to correct a distortion in the image plane on a field-side individualized optical element. The distortion is here calculated from the local inclination of the field-point-dependent wavefront error. In addition, the image field curvature can also be calculated from the total wavefront error at all field points, for example as field-point-dependent defocus coefficient when decomposing the total wavefront error into Zernike polynomials.

A contribution to the total wavefront error can also occur with ideal optical arrangements. This contribution, referred to as a nominal error, can be taken into account for each field point and be included in the calculation in step d).

In one embodiment of the method according to the invention, the individualized optical elements can be bare parts. Bare parts are individualized optical elements which are not yet coated, for example not yet provided with an antireflection layer. The bare parts can be mounted. It is generally known that stresses and deformations of an optical element can be caused by a mount, which can additionally cause individual wavefront errors. Individual optical properties caused by a mount can in step a-2) be measured and stored separately and/or as a contribution to the individual optical properties of the respective individualized optical element.

In one developing embodiment of the method according to the invention, the at least one selected individualized optical element is a bare part.

If at least one individualized optical element is a bare part, in step f) all bare parts are transferred into a finished state before the actual production of the optical arrangement. This refers to all finishing steps and processes, by which a bare part is converted into a fully functional individualized optical element. This refers in particular to the application of one-layer or multilayer coatings on and/or the attachment of a mount on the individualized optical element.

Correction of the total wavefront error on an optical arrangement having bare parts permits a very flexible selection of the individualized optical elements or of the surfaces or subapertures to be changed. This is expedient especially if a dominating contribution to the total wavefront error is made by what are known as bare part errors. Bare part errors are for example caused by irregularities on the surfaces of the bare parts. When the method according to the invention is executed, each individualized optical element and any number of individualized optical elements can be selected. As a result, the tolerance limits permissible for the bare parts can be increased and thus money can be saved and throughput times through the manufacturing chain can be reduced.

If the total wavefront error is corrected largely on the basis of individualized optical elements which are already coated and mounted, the selected individualized optical elements should preferably be determined in advance. They initially remain uncoated and can be mounted in specific mounts. This somewhat limits the flexibility of the method according to the invention. However, errors that result from the mounting or coating can be compensated for.

When the method according to the invention is executed, the number of individualized optical elements selected in step c) can be determined in dependence on the virtually ascertained total wavefront error. For example, a selection can be made under the criterion that as few individualized optical elements as possible must be selected or that the changes necessary for each selected individualized optical element are kept as small as possible. It is also possible to define an upper and/or a lower limit for the number of selected individualized optical elements. When selecting a relatively large number of individualized optical elements, the individual tolerances of the selected individualized optical elements can be selected to be relatively large, such that the manufacturing complexity for each individualized optical element decreases. If only one individualized optical element is selected, it is necessary during the processing thereof to observe significantly tighter tolerance limits. In a further embodiment, it is also possible for the individualized optical elements having the largest contribution to the total wavefront error to be selected and for its optical properties to be changed so as to keep the total wavefront error within the permissible tolerance.

By selecting the number of selected individualized optical elements, it is possible to conduct the method in a flexible manner. What is expedient, although not necessary, is if the selected individualized optical elements are bare parts. By adapting the number of selected individualized optical elements, it is possible for a tolerance to be observed to be selected such that it is large, as a result of which manufacturing costs are saved. A bare part is an optical element which is not (yet) coated. Bare parts are processing states of optical elements which have not yet been completely finished.

A change in the optical properties of the at least one selected individualized optical element is done virtually by treating at least one surface of the selected individualized optical elements as a correction area. The correction area can be described by two-dimensional or three-dimensional coordinates. Further features can be assigned to the coordinates such that a multidimensional description of the correction area is possible. The correction area can also be in the form of a function system, such as for example using the Zernike functions or Hankel functions, B-splines or NURBS ("Nonuniform rational B-splines"). It is also possible to change the refractive index locally or to apply or to process diffractive structures on/into the surface (correction area). Here, the correction area is measured before and after processing and compared to a calculated predetermined area. If the correction area with permissible tolerances corresponds to the predetermined area, the optical arrangement can be produced. The changes to the optical properties of the at least one selected individualized optical element can be carried out on one or on both sides of the selected individualized optical element.

Owing to the coordinate-correct storing of the individual wavefront errors of the individualized optical elements, the latter can also be changed with respect to their rotary position and be calculated virtually with the changed rotary position in the optical arrangement. As a result, possible advantageous compensatory effects can be used which are achieved by a changed rotary position of one or more individualized optical elements relative to one another.

It is possible that in the optical arrangement, an individualized optical element is provided which provides no contribution to the overall wavefront error per se, i.e. is optically neutral. For example, a plane plate may be provided in a region of the beam path of the optical arrangement with parallel beam guidance. At least one surface of the plane plate is provided as a correction area. If a correction of the total wavefront error is deemed necessary, the plane plate is selected and the optical properties thereof are changed accordingly. The plane plate is then an individualized optical element of the optical arrangement and optically not neutral. The advantage here is that all other individualized optical elements can already have their respective finished state, for example can have been coated and mounted in a final stage. Only the optical properties of the selected individualized optical element are changed. It is also possible for the selected individualized optical element to not be integrated in the optical arrangement if a calculated total wavefront error is within permissible tolerance limits and no correction is necessary.

The object is further achieved by a modification of the method according to the invention. Here, step f) is provided only as an optional feature. With this modification, a correction method is proposed by means of which a wavefront-corrected optical arrangement can be provided purely virtually.

Processing in step f) can be carried out for example using a local correction method (zonal correction polishing), IBF (Ion Beam Figuring), MRF (Magneto Rheological Finishing), FJP (Fluid Jet Polishing), CCP (Computer-Controlled Polishing), according to the calculated correction.

Preferably, the method according to the invention is used in optical arrangements for use with UV radiation in the field of semiconductor lithography. It can also be used in other fields of use however and is not limited to imaging optical arrangements.

Several advantages are achieved with the method according to the invention. Firstly, the construction of optical arrangements that are difficult to correct is avoided. Owing to the realistic calculation, optical elements in general and individualized optical elements specifically can be identified. If further contributions to the total wavefront error are caused, for example, by mounting, they are usually of a simple nature (for example astigmatism). The total wavefront error of the optical arrangement can be optimized early in the manufacturing process and be carried out individually for each optical arrangement. In addition, changes to selected individualized optical elements can be carried out simultaneously. The throughput time through the manufacturing process is thereby advantageously shortened. Compared to a pure measurement, the calculated grid can be selected to be much narrower, as a result of which artefacts caused by a grid that is too rough are avoided. If measurements are carried out on very fine grids, a lot of (measurement) time is necessary for these measurements. The method according to the invention also permits larger tolerances for the optical elements, since they can be corrected. As a result, the rejection rate during production of optical elements is advantageously reduced. In the method according to the invention, data such as individual identifiers and surface errors of optical elements that are stored with the correct coordinates can be used, which are in many cases either ascertained and stored anyway, or can be collected with comparatively little effort.

The invention will be explained in more detail below with reference to figures and exemplary embodiments. In the figures:

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
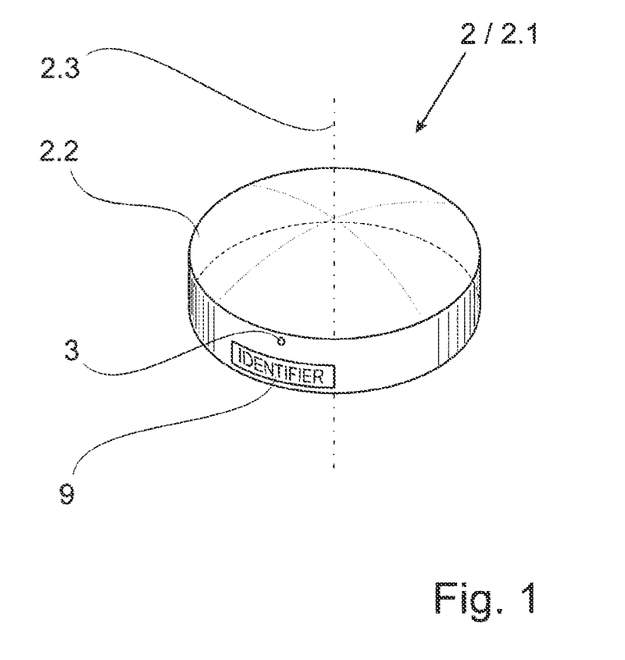
FIG. 1 shows a simplified illustration of an individualized optical element.

FIG. 1 shows in a simplified manner a lens as an individualized optical element 2.1 in a semi-perspective illustration. The individualized optical element 2.1 has a planar circumferential face which extends coaxially with an optical axis 2.3 running through the center point of the individualized optical element 2.1. A lateral surface 2.2 of the optical individualized element 2.1 faces the observer. Provided on the circumferential face of the individualized optical element 2.1 is a mark 3 in the form of a point. The mark 3 is applied such that it is offset toward that lateral surface 2.2 that faces in the direction of an object plane 7.1 in a virtual optical arrangement 1 (see FIGS. 2 and 3). Likewise provided on the circumferential face is an identifier 9, by which the individualized optical element 2.1 is individualized by way of a unique letter/number sequence (here symbolized by "identifier") being assigned to an optical element 2 and being noted on the identifier 9.

Figure 2:
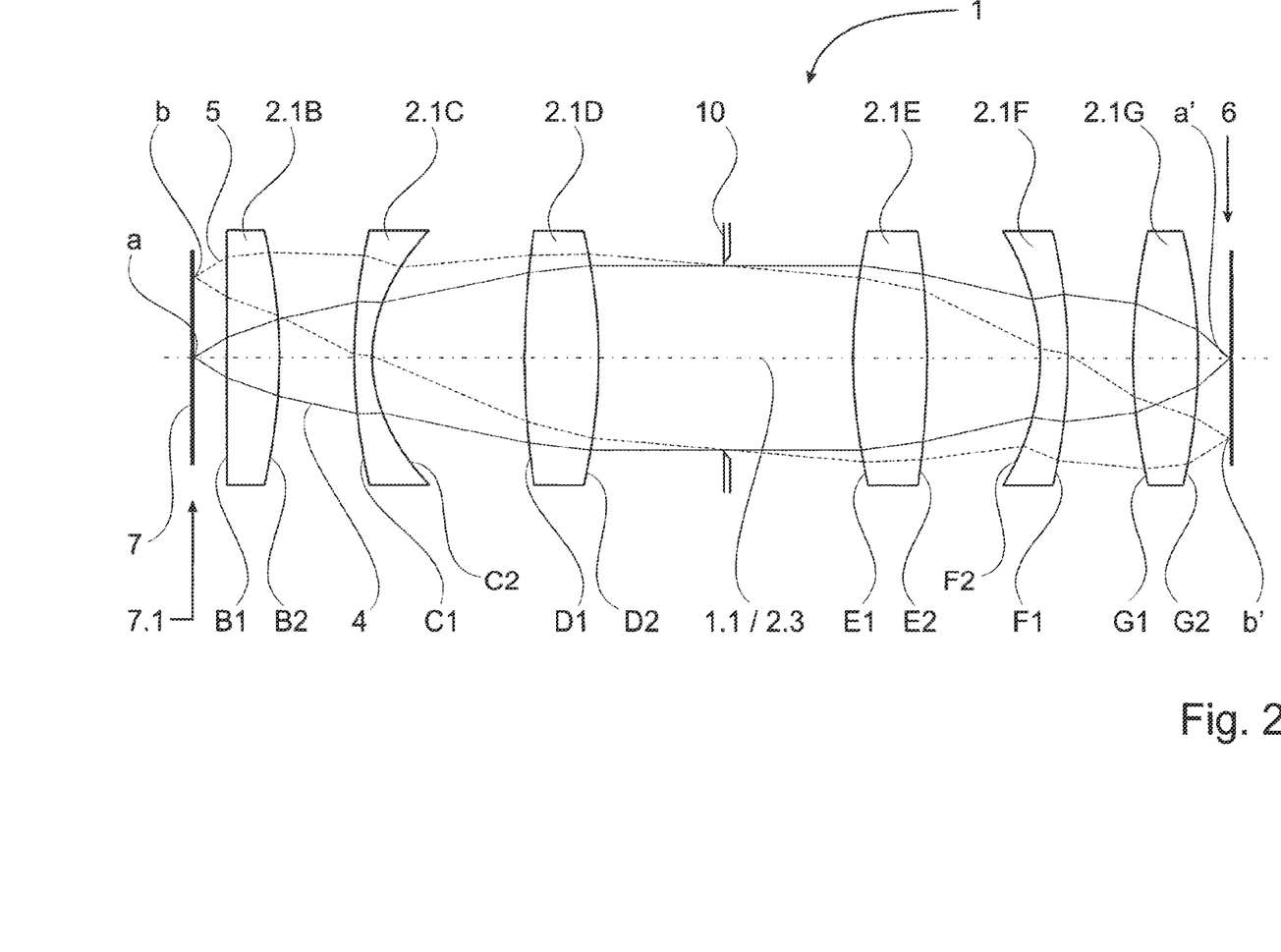
FIG. 2 shows a schematic illustration of a first exemplary embodiment of a virtual optical arrangement with individualized optical elements.

A first exemplary embodiment of a virtual optical arrangement 1, illustrated in FIG. 2, has, as essential components, a number of individualized optical elements 2.1B to 2.1G and a stop 10 along an optical axis 1.1 of the virtual optical arrangement 1 and an image plane 6 and an object plane 7.1 in which an object 7 can be located. The optical axes 2.3 of the individualized optical elements 2.1B to 2.1G and the optical axis 1.1 of the virtual optical arrangement 1 coincide. The first exemplary embodiment is strongly schematized and simplified, and serves only to illustrate and explain the invention. Every individualized optical element 2.1B to 2.1G has two lateral surfaces, with the lateral surface facing the object plane 7.1 having the index 1 (B1, C1, . . . G1), and the lateral surface facing the image plane 6 having the index 2 (B2, C2, . . . G2).

Selected by way of example from any desired number of virtual beams, a first virtual beam 4 and a second virtual beam 5 are shown starting from the object 7. The first virtual beam 4 is assigned to a field point a and the second virtual beam 5 is assigned to a field point b. The field points a and b are located in a matrix of field points (see FIG. 3). The first virtual beam 4 starts from the field point a of the object 7 and propagates along the optical axis 1.1 in the virtual optical arrangement 1. In doing so, the rays of the first virtual beam 4 diverge. The rays of the first virtual beam 4 are parallelized by the effect of the individualized optical elements 2.1B to 2.1D. The first virtual beam 4 has its greatest cross section across a section of the virtual optical arrangement 1 between the optical elements 2.1D and 2.1E. Owing to the effect of the individualized optical elements 2.1E, 2.1F and 2.1G, the rays of the first virtual beam 4 converge again and image the field point a as the field point a' in the image plane 6. The second virtual beam 5 propagates starting from the field point b. The field point b is arranged on the object plane 7.1 next to the point of intersection between the optical axis 1.1 and the object plane 7.1. The second virtual beam 5 is likewise spread and parallelized by the individualized optical elements 2.1B to 2.1D and converges again by way of the individualized optical elements 2.1E, 2.1F and 2.1G before it is imaged as the field point b' in the image plane 6. The lateral surface D1 is provided as a correction area. The individualized optical element 2.1D is a selected optical element that is selected from the individualized optical elements 2.1B to 2.1G of the optical arrangement 1 for the correction of a total wavefront error.

Figure 3:
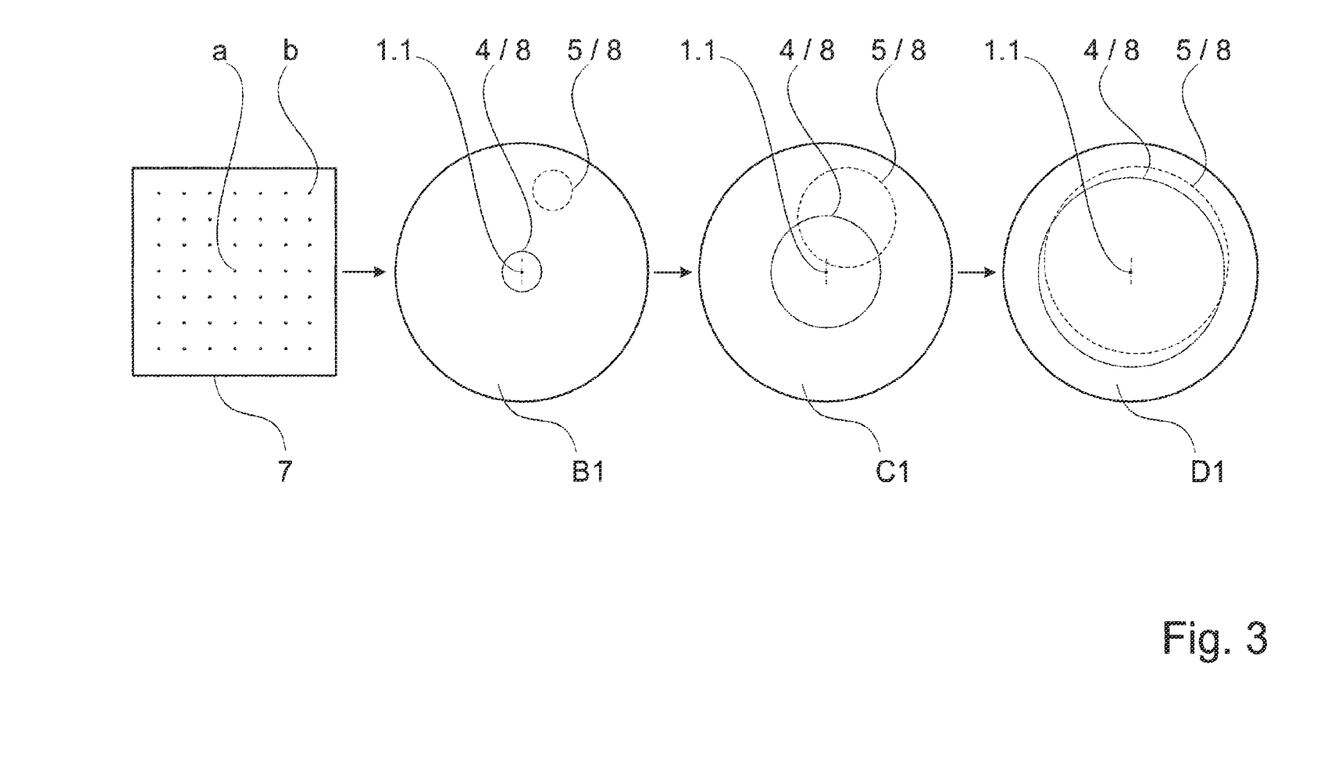
FIG. 3 shows a sequence of schematically illustrated subapertures of the individualized optical elements of the first exemplary embodiment.

FIG. 3 illustrates a face of the object 7 facing the virtual optical arrangement 1 and the lateral surfaces B1, C1 and D1 of the individualized optical elements 2.1B, 2.1C and 2.1D (see FIG. 2) in plan view. Field points are shown arranged in a matrix on the object 7. Owing to the matrix, the field points are arranged in a regular grid with identical grid spacings with respect to one another. The field points are designated a and b for illustrative purposes. The first and the second virtual beams 4, 5 are spread relative to the field points a and b and are imaged as projections on the lateral surface B1. Said projections have a shape and size that are determined by the cross section of the virtual beams 4, 5 and by the shape of the lateral surface B1 and are referred to as subapertures 8. A relative position of each subaperture 8 to the optical axis 1.1 is determined by the position of the field points in the matrix and by the position of the respectively considered lateral surface B1 to G2 of the optical elements B to G in the optical arrangement. The subaperture 8 of the first virtual beam 4 extends symmetrically about the optical axis 1.1. The subaperture 8 of the second virtual beam 5 is located on the lateral surface B1 in a relative position to the optical axis 1.1, which corresponds to the relative position of the field point b in the matrix.

The subaperture 8 of the first virtual beam 4 present on the lateral surface C1 is again symmetrical about the optical axis 1.1 and spread with respect to the subaperture 8 on the lateral surface B1. The size of the subaperture 8 of the second virtual beam 5 is likewise increased and the subaperture 8 partially overlaps with the subaperture 8 of the first virtual beam 4.

The subapertures 8 of the first and second virtual beams 4, 5 are present on the lateral surface D1 about the optical axis 1.1 and nearly completely overlap one another. Additionally, a free surface, i.e. a surface not covered by a mount, of the individualized optical element 2.1D is nearly completely filled by the subapertures 8.

Figure 4:
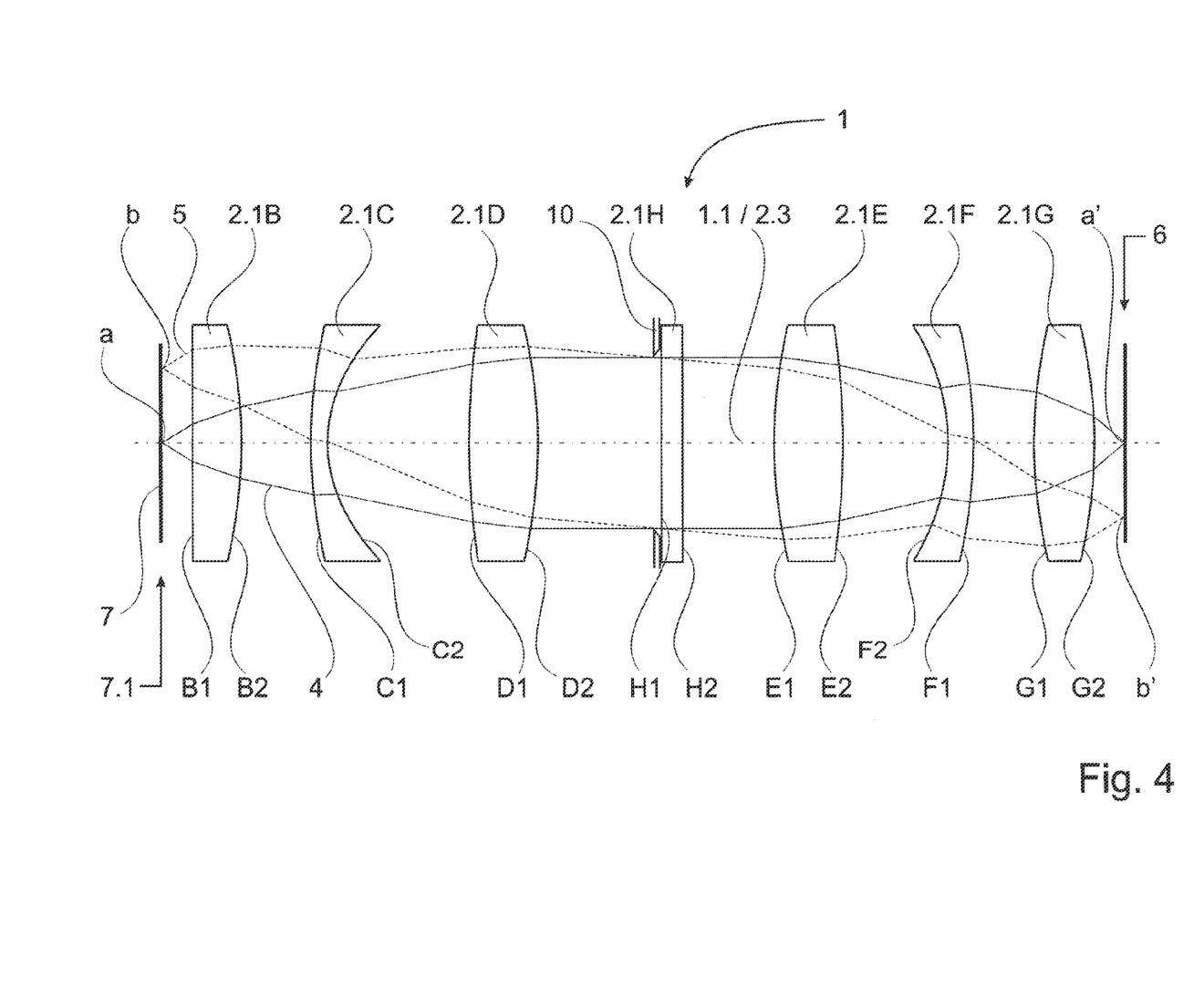
FIG. 4 shows a schematic illustration of a second exemplary embodiment of a virtual optical arrangement with individualized optical elements having a plane plate.

A second exemplary embodiment of the optical arrangement 1 according to FIG. 4 corresponds to the first exemplary embodiment, with the difference that an individualized optical element 2.1H having lateral surfaces H1 and H2 is arranged between the individualized optical elements 2.1D and 2.1E next to the stop 10. The rays of the virtual beams 4, 5, but also the rays of all virtual beams that are not shown extend parallel to one another between the individualized optical elements 2.1D and 2.1E. The individualized optical element 2.1H is configured as a plane plate made of optical glass. The individualized optical element 2.1H is neutral in terms of its optical effect.

The method according to the invention will be explained below with reference to FIGS. 1 to 3. A number of different optical elements 2 is produced. Each optical element 2 is assigned an identifier 9 with which the optical element 2 is individually characterized, i.e. individualized (FIG. 1). In addition, a mark 3 is applied on the edge of the optical element 2.1 that is thus individualized. Starting from the mark 3, every point on the surface of the individualized optical element 2.1 can be uniquely described by a suitable coordinate system (Cartesian coordinate system, polar coordinate system). Every individualized optical element 2.1 is subsequently measured, and irregularities on the surface of the individualized optical element 2.1 are captured with the correct position and coordinate regarding their position, shape and extent on a surface of the individualized optical element 2.1 and with respect to the quality of the respective irregularity and the optical effects that can thus be expected, and are stored, in a manner in which they are assigned to the individualized optical element 2.1, in a database (not illustrated) as measurement data. A position and the coordinates of the individualized optical element 2.1 are captured with respect to the mark 3 which is present on the individualized optical element 2.1.

In order to virtually produce a virtual optical arrangement 1, individualized optical elements 2.1B to 2.1G are selected, in correspondence with the optical elements 2 that are necessary for production, from the database and the measurement data thereof is made available. The individualized optical elements 2.1B to 2.1G are arranged virtually along the optical axis 1.1 with known extents for the lateral surfaces (position) and with a known rotary position. The rotary position is given, and known, by the known position of the mark 3 with respect to a defined reference position about the optical axis 1.1.

A total wavefront error is ascertained by generating virtual beams 4, 5 in a known grid and with known grid spacings with respect to one another. The profile of said virtual beams 4, 5 through the virtual optical arrangement 1 is calculated (FIG. 3). Convergences, divergences and parallelisms of the virtual beams 4, 5 with respect to one another are calculated here in addition to the profile. Since the measurement data and the position and the rotary position of each individualized optical element 2.1 used in a respective virtual optical arrangement 1 are known, it is possible to calculate the virtual beams 4, 5 of the individual wavefront errors present on a lateral surface B1 to H2 and those present in each case at a subaperture 8 of an individualized optical element 2.1B to 2.1G with the correct coordinates by using methods that are known to a person skilled in the art.

The respective subaperture 8 and/or the lateral surface or surfaces of each individualized optical elements 2.1 are thus described as coefficients of Zernike polynomials. By way of using an addition operation with the correct sign, a total wavefront error for the virtual optical arrangement 1 is calculated from the individual wavefront errors. In a further embodiment of the method according to the invention, a nominal error (residual error of the optical design) for the virtual optical arrangement 1 is ascertained and included in the calculation of the total wavefront error.

The lateral surface D2 is established as the correction area from the start in the described embodiment of the method according to the invention. The individualized optical element 2.1D is a bare part, while the other individualized optical elements 2.1B, 2.1C, 2.1E, 2.1F and 2.1G have already been coated and mounted and are in the final states. After the total wavefront error is calculated, it is compared to permissible tolerance limits. If the total wavefront error is outside the permissible tolerance limits, a calculation that is correct in terms of position and coordinates is carried out as to what changes need to be carried out regarding the selected optical element 2.1D, and specifically on the correction area D2, so as to obtain a total wavefront error that is within the permissible tolerance limits. The necessary virtual changes with which the tolerance limits are observed are stored as processing data.

Subsequently, the selected individualized optical element 2.1D is processed and changed in correspondence with the processing data. After processing, the selected individualized optical element 2.1D is coated and mounted.

The individualized optical elements 2.1B to 2.1G, with which the virtual optical arrangement 1 was produced, are now used in reality to produce an optical arrangement and are arranged along an optical axis 1.1 of the actual optical arrangement (not illustrated) with the correct position and coordinates. If appropriate, the individualized optical elements 2.1B to 2.1G are then further adjusted.

In a further embodiment of the method according to the invention, the individualized optical element 2.1H in the virtual optical arrangement 1 according to FIG. 4 is positioned in a section of the virtual optical arrangement 1, above which the virtual beams nearly completely overlap and cover the free surface of the optical elements 2.1D, 2.1E which are arranged there. The individualized optical element 2.1H theoretically has no optical effect. At least one of the lateral surfaces H1, H2 is provided as the correction area. The individualized optical element 2.1H is the selected individualized optical element, from which measurement data are likewise captured and stored with the correct position and coordinates.

After the calculation of the total wavefront error for the virtual optical arrangement 1, the changes to the correction area or areas H1 and/or H2 that need to be made are calculated, if necessary, and stored as processing data, with which a total wavefront error within permissible tolerance limits is achieved. If no changes are necessary, it is possible in a further embodiment of the invention to omit the arrangement of the individualized optical element 2.1H.

In a further embodiment of the method according to the invention, a contribution by the individualized optical element 2.1H to the nominal error of the optical arrangement 1 is known and is taken into account. In further embodiments, at least one further individualized optical element 2.1 is selected in addition to the individualized optical element 2.1H.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. A method for producing a wavefront-corrected optical arrangement comprising at least two optical elements, comprising:
   in step a) ascertaining a total wavefront error for the optical arrangement;
   in step b) comparing the total wavefront error to a permissible tolerance range for the total wavefront error;
   in step c) selecting at least one of the optical elements if the permissible tolerance range is exceeded; and
   in step d) changing the optical properties of the at least one selected optical element such that the ascertained total wavefront error for the optical arrangement will be within the permissible tolerance range,
   wherein the method further comprises:
   before step a):
      in step a-2) individualizing the optical elements by assigning them in each case an individual identifier, such that individualized optical elements are present, measuring individual surface errors with correct coordinates for all individualized optical elements, and storing the measured individual surface errors with the correct coordinates in a manner in which they are assigned to a respective individualized optical element, and
      in step a-1) producing the optical arrangement with the individualized optical elements virtually as a virtual optical arrangement,
   wherein in step a), ascertaining the total wavefront error of the virtual optical arrangement, by way of calculation, from the individual surface errors and obtaining a calculated total wavefront error, wherein the total wavefront error is the totality of wavefront errors over all field points, such that correction of the total wavefront error is made possible for all field points simultaneously;
   wherein in step b), comparing the calculated total wavefront error of the virtual optical arrangement to the permissible tolerance range for the total wavefront error,
   wherein in step d) changing the optical properties of an at least one selected individualized optical element virtually such that the calculated total wavefront error for the virtual optical arrangement will be within the permissible tolerance range,
   wherein the method further comprises:
      in step e) storing the virtually effected changes to the optical properties of the at least one selected individualized optical element as processing data and made available such that they can be retrieved repeatedly, and
      in step f) processing the at least one selected individualized optical element according to the processing data, and producing the optical arrangement with the individualized optical elements.

2. The method as claimed in claim 1, wherein in step a) considering any desired number of field points, and producing virtual beams for each field point, and calculating the projection thereof onto each surface of each individualized optical element while it passes through the virtual optical arrangement as a subaperture.

3. The method as claimed in claim 2, further comprising:
   for each field point, calculating a respective wavefront error from the individual surface errors of the subaperture and storing the calculated wavefront error.

4. The method as claimed in claim 3, further comprising:
   deriving a contribution to the calculated total wavefront error from each subaperture.

5. The method as claimed in claim 4, further comprising:
   adding up the derived contributions to the calculated total wavefront error with the correct sign and the correct orientation.

6. The method as claimed in claim 4, further comprising:
   decomposing the derived contributions to the calculated total wavefront error into coefficients, and subsequently adding up the coefficients with the correct sign and the correct orientation.

7. The method as claimed in claim 1, further comprising:
   arranging virtual beams in any desired grid with known grid spacings with respect to one another.

8. The method as claimed in claim 7, further comprising:
   selecting the grid spacings such that the subapertures overlap on the surface of at least one selected individualized optical element.

9. The method as claimed in claim 1, further comprising:
   adding a contribution known as a nominal error of an ideal optical arrangement to the calculated total wavefront error for each field point.

10. The method as claimed in claim 1, further comprising:
    correcting a distortion in an image plane additionally on a field-side individualized optical element.

11. The method as claimed in claim 1, wherein the individualized optical elements are not coated.

12. The method as claimed in claim 11, wherein, in step f) all uncoated individualized optical elements are transferred into a finished state before the production of the optical arrangement by additional steps of coating and mounting on the optical element.

13. The method as claimed in claim 1, wherein the at least one selected individualized optical element is not coated.

14. The method as claimed in claim 1, wherein the number of the individualized optical elements selected in step c) depends on virtually ascertained total wavefront error.

15. The method as claimed in claim 1, further comprising selecting combinations of the individualized optical elements from a number of individualized optical elements on the basis of the measurement data, wherein the combinations are selected such that the processing data calculated for a combination is optimized for manufacture.

\* \* \* \* \*